United States Patent
Meyhofer et al.

(10) Patent No.: US 9,855,816 B2
(45) Date of Patent: Jan. 2, 2018

(54) THERMAL REDUCTION SYSTEM FOR AN AUTOMATED VEHICLE

(71) Applicant: Uber Technologies, Inc., San Francisco, CA (US)

(72) Inventors: Eric Meyhofer, Pittsburgh, PA (US); David Rice, Pittsburg, PA (US)

(73) Assignee: Uber Technologies, Inc., San Francisco, CA (US)

( * ) Notice: Subject to any disclaimer, the term of this patent is extended or adjusted under 35 U.S.C. 154(b) by 0 days.

(21) Appl. No.: 14/979,248

(22) Filed: Dec. 22, 2015

(65) Prior Publication Data
US 2017/0174037 A1    Jun. 22, 2017

(51) Int. Cl.
*H05K 7/20*     (2006.01)
*B60H 1/00*    (2006.01)
*B60H 1/32*    (2006.01)

(52) U.S. Cl.
CPC ..... *B60H 1/00271* (2013.01); *B60H 1/00392* (2013.01); *B60H 1/3205* (2013.01); *H05K 7/20881* (2013.01)

(58) Field of Classification Search
USPC ..... 62/513; 361/698, 701, 702, 703; 701/22, 701/36, 23, 301; 165/104.33, 104.34
See application file for complete search history.

(56) References Cited

U.S. PATENT DOCUMENTS

| | | | |
|---|---|---|---|
| 5,537,956 A * | 7/1996 | Rennfeld | B60H 1/00885 123/41.29 |
| 5,590,540 A * | 1/1997 | Ikeda | B60H 1/00735 236/49.3 |
| 6,021,371 A * | 2/2000 | Fultz | G01C 21/3608 340/988 |
| 6,360,835 B1 * | 3/2002 | Skala | B60L 11/1892 123/41.29 |
| 6,394,207 B1 * | 5/2002 | Skala | B60L 11/1892 180/65.1 |
| 6,606,251 B1 * | 8/2003 | Kenny, Jr. | G06F 1/26 257/E23.067 |
| 7,191,858 B2 * | 3/2007 | Vanderwees | F01P 7/165 180/65.31 |
| 7,404,461 B2 * | 7/2008 | Varenne | B60L 1/003 180/65.1 |
| 7,424,868 B2 * | 9/2008 | Reckels | F01P 7/167 123/41.1 |

(Continued)

OTHER PUBLICATIONS

ISR and Written Opinion in PCT/US2016/067718 dated Mar. 20, 2017.

*Primary Examiner* — Richard Goldman
(74) *Attorney, Agent, or Firm* — Mahamedi IP Law LLP (57) ABSTRACT

An automated vehicle (AV) can include a data processing system housed in a cooling rack, and a thermal reduction system to provide cooling for the data processing system. The thermal reduction system can include a fluid pump to pump cooling fluid through the cooling rack, a cabin radiator to receive the cooling fluid and pump cabin air from the interior cabin of the AV to cool the cooling fluid, and a main radiator to receive the cooling fluid and pump outside air to further cool the cooling fluid. Additionally, the thermal reduction system can include a secondary cooling unit that includes a condenser, evaporator, and compressor pump to further cool the cooling fluid.

16 Claims, 6 Drawing Sheets

(56) References Cited

U.S. PATENT DOCUMENTS

| | | | |
|---|---|---|---|
| 8,373,099 B2* | 2/2013 | Lifson | H01M 8/04007 165/205 |
| 8,402,776 B2* | 3/2013 | Johnston | B60L 3/0046 62/513 |
| 8,599,001 B2* | 12/2013 | Schofield | B60N 2/002 340/425.5 |
| 8,820,351 B1* | 9/2014 | Harrington | H05K 7/20281 137/595 |
| 2007/0261648 A1* | 11/2007 | Reckels | F01P 7/167 123/41.12 |
| 2008/0251235 A1* | 10/2008 | Zhou | B60H 1/00278 165/41 |
| 2009/0301125 A1 | 12/2009 | Myles | |
| 2010/0032150 A1* | 2/2010 | Determan | F28D 15/0266 165/246 |
| 2010/0305794 A1 | 12/2010 | Foster | |
| 2010/0316255 A1 | 12/2010 | Mathony | |
| 2011/0246023 A1* | 10/2011 | Lockwood | F01P 7/10 701/36 |
| 2012/0087088 A1* | 4/2012 | Killion | F28D 15/0266 361/697 |
| 2012/0180979 A1* | 7/2012 | Harrington | F28D 1/0246 165/11.1 |
| 2012/0316711 A1* | 12/2012 | Christian | H01L 23/473 701/22 |
| 2013/0238233 A1* | 9/2013 | Kim | B60K 6/00 701/301 |
| 2013/0255601 A1* | 10/2013 | Gooden | F28F 27/02 123/41.08 |
| 2013/0261942 A1 | 10/2013 | McQuade | |
| 2014/0157803 A1* | 6/2014 | Pebley | F25B 41/00 62/89 |
| 2014/0229059 A1* | 8/2014 | Surnilla | B60H 1/00785 701/36 |
| 2015/0316334 A1 | 11/2015 | Chainer | |
| 2016/0120019 A1* | 4/2016 | Shedd | H05K 1/0204 361/679.47 |

\* cited by examiner

THERMAL REDUCTION SYSTEM FOR AN AUTOMATED VEHICLE

BACKGROUND

Automated or autonomous vehicles (AVs) may require continuous data processing using a data processing system that can generate a large amount of heat. A critical design parameter for continuous processing systems is performance per watt, since the performance of such processing systems typically rely on the performance of their cooling systems. For AVs, maintaining peak performance of on-board processing units may be crucial to achieve reliability and safety. Therefore, maintaining the on-board processing units within an optimal operational environment can be crucial to progressing AV technology.

BRIEF DESCRIPTION OF THE DRAWINGS

The disclosure herein is illustrated by way of example, and not by way of limitation, in the figures of the accompanying drawings in which like reference numerals refer to similar elements, and in which.

DETAILED DESCRIPTION

A thermal reduction system is provided in connection with a data processing system of an AV. The AV can include a number of sensors, such as stereo cameras, radar equipment, light detecting and ranging (LiDAR) equipment, motion sensors, and the like. The on-board data processing system can process the AV sensor data to control the operation of the AV on surface streets and in traffic. In many aspects, the AV can require continuous data processing for normal operation which, for current processing systems, can generate an enormous amount of heat. For example, the AV may require in the order of hundreds of state-of-the-art processing cores (e.g., 160 cores) and/or field programmable gate arrays (FPGAs) packaged within a confined space within the AV (e.g., in the trunk space or in an undercarriage module).

In order to achieve peak or near-peak performance of the data processing system, the generated heat must be dissipated such that an optimal operating environment for the data processing system is provided. For custom built AVs, cooling systems can be planned into the overall design of the AV. For example, an integrated data processing system can be designed with a customized cooling rack, which can utilize various cooling components under the hood, or dual purpose cooling components can be utilized, such as the AV's air conditioning (A/C) system. For retrofitted AVs from normal operating vehicles, utilization of various cooling components of the vehicle is possible, as well as the addition of purpose built cooling components, such as radiators drawing air from both the interior cabin of the vehicle, and externally from the outside.

In either case, the thermal reduction system described herein can provide a stepped cooling procedure that can depend on ambient conditions and/or cooling fluid temperature in order to maintain the operating environment of the data processing system within a nominal temperature range. The thermal reduction system can provide liquid cooling and be implemented to transfer heat from any number of heat sources in the AV, such as the on-board data processing system or the vehicle battery pack. The thermal reduction system can utilize a plurality of sensors to detect external environment data as the AV operates, as well as monitor the cooling fluid temperature at a number of locations within the fluid lines running through the thermal reduction system. The thermal reduction system can process the external environment data and/or the fluid temperature data to control a flow rate of the cooling fluid through the fluid lines using fluid pump.

Additionally, the fluid lines of the thermal reduction system can run to one or more heat sources of the AV, through one or more radiators (i.e., a primary cooling unit or sub-system), and through an evaporator and/or condenser of a secondary cooling unit or sub-system that can be initiated based on a number of conditions. Such conditions can include high heat/humidity ambient conditions, increased computing requiring a ramp-up of the on-board data processing system (e.g., when the AV enters a high-traffic/high pedestrian area), a predetermined rate of change in cooling fluid temperature, the cooling fluid reaching a predetermined threshold temperature (e.g., 48° C.), and the like.

In certain implementations, the primary cooling unit of the thermal reduction system can include a cabin radiator that includes an air pump or fan to draw air from the interior cabin of the AV through its radiator core (comprising fins or vanes). In hot ambient conditions, the interior cabin air is typically far cooler due to, for example, the passengers running the A/C system of the AV. The thermal reduction system can utilize interior sensors (e.g., pressure sensors on the seats or an interior camera) to detect a number of passengers inside the AV. Based on the number of passengers, the thermal reduction system can vary an established upper limit to the air flow rate from the cabin through the cabin radiator. For example, if there is only one passenger in the AV, the thermal reduction system can increase the air flow rate limit from the interior cabin (e.g., to over 150 cubic feet per minute (cfm)) through the cabin radiator. If there are five or more passengers in the AV, the thermal reduction system can decrease the air flow limit (e.g., to around 85 cfm).

The primary cooling unit of the thermal reduction system can further include a main radiator that draws air from the exterior of the AV. The main radiator can include an air pump or fan, and the thermal reduction system can vary the air flow rate of external air without limit (or limited only by the fan or air pump specification). In some aspects, the main radiator can further be positioned to take advantage of ram air, such as at the front of the AV, or on another forward facing surface (e.g., within a wheel well). The fluid lines can be run through both the cabin radiator and the main radiator, and the thermal reduction system can vary the air flow rates through both the cabin radiator (restricted by the upper flow limit) and the main radiator dynamically when the primary cooling unit is being utilized.

In certain conditions, the primary cooling unit may not be sufficient to adequately maintain optimal temperatures for the on-board data processing system of the AV. Accordingly, in many implementations, the thermal reduction system can initiate the secondary cooling unit (e.g., an A/C unit), which can be installed in series with the primary cooling unit. The secondary cooling unit can include a compressor pump that is triggered by the thermal reduction system when additional cooling is required. The secondary cooling unit can further include a condenser and an evaporator, through which the fluid lines of the thermal reduction system can be run to further exchange heat from the cooling fluid. The compressor pump can be triggered by the thermal reduction system to pump high pressure coolant through the condenser, which can liquefy the high pressure coolant, and then through the evaporator, which can atomize and supercool the coolant. The secondary cooling unit can include a thermal expansion valve to control superheating at the outlet of the evaporator and restrict flow through the evaporator to create the pressure drop for atomization.

According to examples described herein, the thermal reduction system can process data from a number of sensors to control the operation of the primary and secondary cooling units. The data can comprise the cooling fluid temperature proximally and/or distally from the heat source (e.g., the on-board data processing system of the AV). The data can further comprise sensor data indicating a number of passengers within the AV (e.g., to reestablish or reset the flow rate limit for the cabin radiator), temperature and/or humidity sensor data indicating ambient conditions, polling data indicating processing requirements of the on-board data processing system, etc. Using such data, the thermal reduction system can dynamically operate the primary and secondary cooling units in order to maintain nominal operational temperatures for the data processing system.

Among other benefits, the examples described herein achieve a technical effect of increasing cooling controls to maintain an ideal operational environment for a data processing system of an AV. The described thermal reduction system provides a dynamic and stepped process to further increase precision in cooling for heat sensitive equipment requiring an optimal operational environment, such as the on-board data processing system, comprising any number of processing cores and/or FPGAs.

Description of a cabin radiator system, a main radiator system, and an evaporator/condenser system are provided herein. The following description provides a combination of these systems as integrated components of a single thermal reduction system. However, one or more of these systems may be excluded or act as a standalone cooling system for an AV as dependent on an AV's thermal capacity, electronics thermal requirements, and electronics heat generation. Some environments (e.g., cooler climate zones) may require only one or two of the aforementioned components described herein. For example, certain AV's may operate in areas in which only a cabin radiator is required. Other AV's may operate in areas in which a cabin radiator is required in combination with a main radiator—or a cabin radiator in combination with an evaporator/condenser system. And yet others may require the advanced cooling of an specialized evaporator/condenser system (described herein), but no cabin or main radiator. Accordingly, embodiments described herein provide a thermal reduction system comprising any combination of the cabin radiator, the main radiator, and the evaporator/condenser systems discussed herein. Furthermore, the thermal reduction system discussed with respect to FIG. 1 incorporates all such systems for illustrative purposes, each of which may be activated, deactivated (or initiate power reduction), or removed based ultimately on the cooling requirements of the AV's electronic systems and the ambient conditions of the AV itself.

As used herein, a computing device refers to devices corresponding to desktop computers, cellular devices or smartphones, personal digital assistants (PDAs), laptop computers, tablet devices, television (IP Television), data storage devices, hard drives, solid state media, etc., that can provide network connectivity and processing resources for communicating with the system over a network. A computing device can also correspond to custom hardware, in-vehicle devices, or on-board computers, etc. The computing device can also operate a designated application configured to communicate with the network service.

One or more examples described herein provide that methods, techniques, and actions performed by a computing device are performed programmatically, or as a computer-implemented method. Programmatically, as used herein, means through the use of code or computer-executable instructions. These instructions can be stored in one or more memory resources of the computing device. A programmatically performed step may or may not be automatic.

One or more examples described herein can be implemented using programmatic modules, engines, or components. A programmatic module, engine, or component can include a program, a sub-routine, a portion of a program, or a software component or a hardware component capable of performing one or more stated tasks or functions. As used herein, a module or component can exist on a hardware component independently of other modules or components. Alternatively, a module or component can be a shared element or process of other modules, programs or machines.

Some examples described herein can generally require the use of computing devices, including processing and memory resources. For example, one or more examples described herein may be implemented, in whole or in part, on computing devices such as servers, desktop computers, cellular or smartphones, personal digital assistants (e.g., PDAs), laptop computers, printers, digital picture frames, network equipment (e.g., routers) and tablet devices. Memory, processing, and network resources may all be used in connection with the establishment, use, or performance of any example described herein (including with the performance of any method or with the implementation of any system).

Furthermore, one or more examples described herein may be implemented through the use of instructions that are executable by one or more processors. These instructions may be carried on a computer-readable medium. Machines shown or described with figures below provide examples of processing resources and computer-readable mediums on which instructions for implementing examples disclosed herein can be carried and/or executed. In particular, the numerous machines shown with examples of the invention include processor(s) and various forms of memory for holding data and instructions. Examples of computer-readable mediums include permanent memory storage devices, such as hard drives on personal computers or servers. Other examples of computer storage mediums include portable storage units, such as CD or DVD units, flash memory (such as carried on smartphones, multifunctional devices or tablets), and magnetic memory. Computers, terminals, network enabled devices (e.g., mobile devices, such as cell phones) are all examples of machines and devices that utilize processors, memory, and instructions stored on computer-readable mediums. Additionally, examples may be implemented in the form of computer-programs, or a computer usable carrier medium capable of carrying such a program.

System Description

Figure 1:
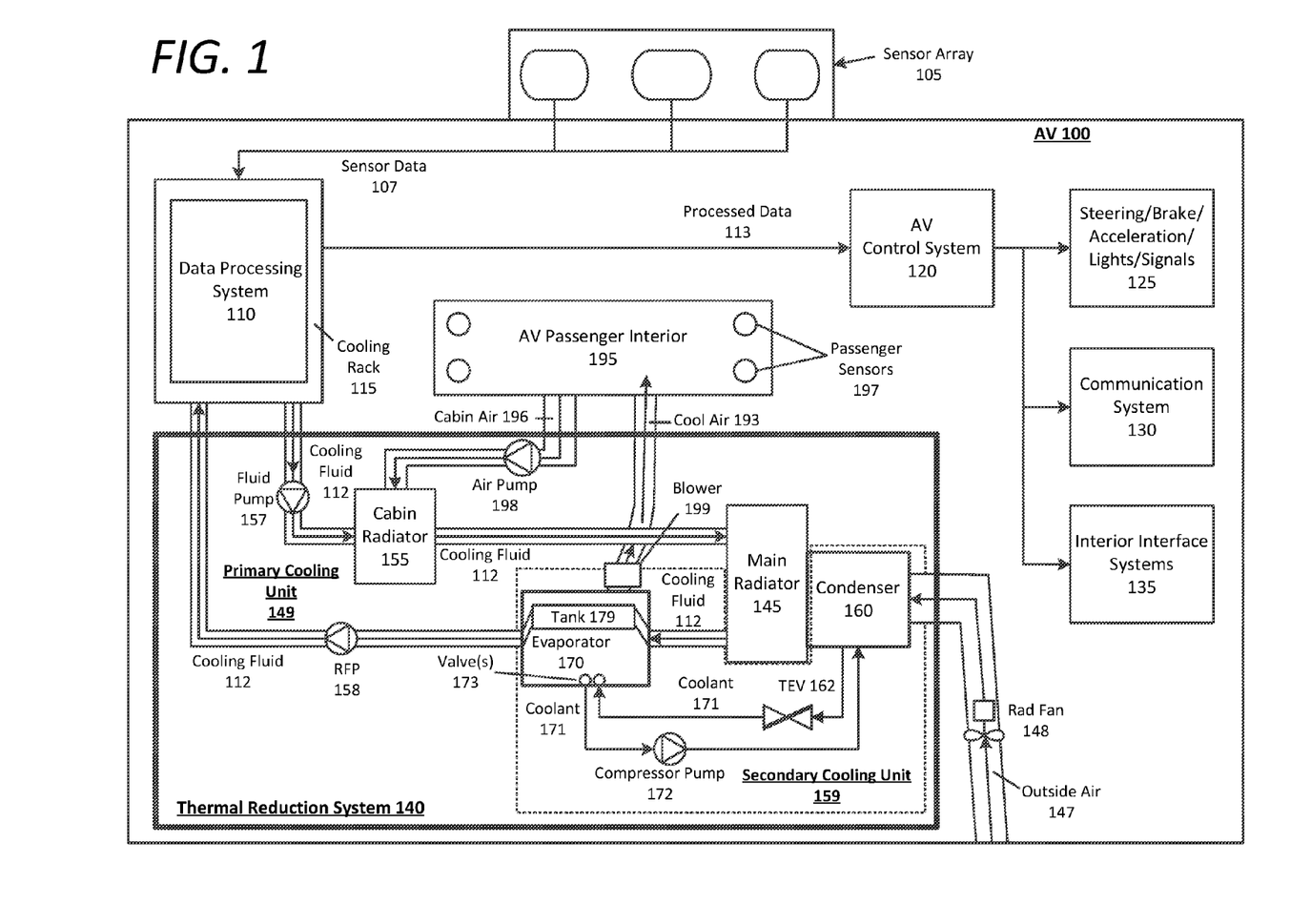
FIG. 1 is a block diagram illustrating an example thermal reduction system, as described herein.

FIG. 1 is a block diagram illustrating an example thermal reduction system for an AV 100. The AV 100 can include a sensor array 105 to detect the AV's 100 driving environment in real time. The sensor array 105 can include any number of standalone cameras, stereo cameras, radars, LiDARs, motion sensors, and the like. In order to operate smoothly, efficiently, reliably, and safely, the AV 100 may require constant processing of sensor data 107 from the sensor array 105. Accordingly, the AV 100 can include a powerful data processing system 110 comprising any number of CPUs and/or FPGAs. The data processing system 110 can continuously process the sensor data 107 and provide the processed data 113 to an AV control system 120, which can control the various operational components of the AV 100.

In the example shown in FIG. 1, the AV control system 120 is shown as a separate component from the on-board data processing system 110 for illustrative purposes. However, the functions of the AV control system 120 may be performed by the data processing system 110 as shown and described with respect to FIG. 1. As such, the AV control system 120 can be implemented as a number of processing and memory resources (e.g., an FPGA) of the on-board data processing system 110—requiring dynamic cooling as described herein.

In many aspects, the AV control system 120 can utilize the processed data 113 to control the steering, brake, acceleration, lights, and signaling systems 125 (e.g., the drive-by-wire system) of the AV 100. Furthermore, the AV control system 125 can control the communications system 130 of the AV 100 when, for example, the AV 100 needs to communicate with other AVs, a central network system or backend server system, or a mapping resource. The AV control system 120 can further control an interior interface system 135 to present data (e.g., travel data) to passengers and/or provide network services (e.g., Internet service) to the passengers. Because safety is an utmost concern for the rollout of AVs 100 into commercial production and widespread use, the AV's 100 data processing system 110 requires an optimal operational environment in any ambient condition.

In order to maintain the sensitive operational environment of the AV's 100 data processing system 110, the AV 100 can include a thermal reduction system 140 to provide liquid cooling to the various components of the data processing system 110. In accordance with examples described herein, the data processing system 110 can be installed in a cooling rack 115 through which fluid lines of the thermal reduction system 140 can be plumbed. The fluid lines can run through the cooling rack 115 in a predetermined manner to provide cooling fluid 112 to the most heat sensitive components first (e.g., the FPGAs and CPUs), and to other less sensitive components thereafter (e.g., CPUs, power units, switches, etc.).

The cooling fluid 112 can be any type of coolant, such as water, glycol-based coolants, betaine, or certain types of oils. Alternatively, the cooling fluid 112 can be a Freon or other refrigerants (e.g., fluorocarbons) for purposes of undergoing phase transitions to provide additional cooling during periods of high volume data processing or hot ambient conditions. Alternatively still, the cooling fluid 112 can contain chemical properties of a hybrid coolant/refrigerant with adequate phase transition temperatures for atomization through an A/C system and yet maintaining a liquid phase through the cooling rack 115 and radiators (e.g., certain types of chloro or fluoro-ethanes).

The thermal reduction system 140 can include one or more fluid pumps 157 (e.g., a primary pump and/or one or more redundant fluid pumps 158) to pump the cooling fluid 112 through the cooling rack 115. Although the fluid pump(s) 157 is illustrated as being positioned between the cooling rack 115 and the cabin radiator 155 in FIG. 1, in other examples, the fluid pump(s) 157 can additionally be or alternatively be positioned between the cooling rack 115 and the evaporator 170. The heated cooling fluid 112 can run through a primary cooling unit 149 comprising a number of radiators. For example, the primary cooling unit 149 can include a cabin radiator 155 that draws cabin air 196 from the passenger interior 195 of the AV 100 using an air pump 198 or fan. The cabin radiator 155 can include a radiator core that can comprise fins or vanes through which the cabin air 196 can be blown through to cool the cooling fluid 112. In certain implementations, the thermal reduction system 140 can prioritize the cabin radiator 155 and air pump 198 for initial cooling when the heat load from the data processing system 110 is minimal. Accordingly, in certain conditions (e.g., when the ambient air temperature external to the AV 100 is abnormally high), the thermal reduction system 140 can run the air pump 198 to draw cool air (i.e., from the air-conditioned passenger interior 195) through the cabin radiator 155 to cool the cooling fluid 112.

In some aspects, the passenger interior 195 of the AV 100 can include a number of passenger sensors 197, such as pressure sensors in the seats or an interior camera. The thermal reduction system 140 can identify a number of passengers within the interior 195 and can set an upper limit to the air flow rate of cabin air 196 from the passenger interior 195 of the AV 100. For example, when there are no passengers, the air flow rate from the interior 195 can be limitless, and thus only limited by the specifications of the air pump 198. When there is one passenger, the thermal reduction system 140 can limit the air flow rate to N cfm (e.g., 150 cfm). For each additional passenger, the thermal reduction system 140 can further limit the air flow rate from the passenger interior 195 to (N-nc) cfm (where n is the number of passengers and c is a predetermined constant (e.g., 20 cfm).

In many examples, the number of passengers can set an upper limit to the air flow rate from the passenger interior 195. Accordingly, when the upper limit is reached by the air pump 198 and additional cooling is required, the thermal reduction system 140 can initiate one or more additional cooling elements. In certain implementations, the thermal reduction system 140 can further utilize the AV's 100 A/C system to increase cooling, which can reduce the need for an additional compressor and condenser.

According to examples described herein, the primary cooling unit 149 can further include a main radiator 145 that draws outside air 147 through its radiator core using a radiator fan 148 or air pump. The main radiator 145 can further take advantage of ram air by being placed proximate to a forward facing surface of the AV 100 (e.g., at the front or within a wheel well). During operation, the thermal reduction system 140 can continuously monitor the temperature of the cooling fluid 112 proximal to and/or distal from the cooling rack 115 in order to adjust an air flow rate for the radiator fan 148 of the main radiator 145 and the air pump 198 of the cabin radiator 155. Furthermore, the thermal reduction system 140 can also control the fluid pump 157 to adjust a fluid flow rate of the cooling fluid through the fluid lines (e.g., based on sensed temperatures or a temperature delta within the fluid lines).

For example, in a relatively low processing mode (e.g., when the AV 100 is in a low traffic and relatively featureless environment), the data processing system 110 may require less cooling. In this state, the thermal reduction system 140 can shut down the primary cooling unit 149 and can monitor the cooling fluid 112 temperature distal from the cooling rack 115. If the temperature crosses a first threshold (e.g., 40° C.), the thermal reduction system 140 can initiate the primary cooling unit 149 to transfer heat away from the cooling fluid 112 through the radiator cores of the main radiator 145 and/or the cabin radiator 155. Furthermore, based on the cooling fluid 112 temperature, the thermal reduction system 140 can control the fluid pump 157 to increase (e.g., at hotter temperatures) or decrease (e.g., at lower temperatures) the flow rate of the cooling fluid 112. Further still, the thermal reduction system 140 can adjust the radiator fan 148 and the air pump 198 to vary the air flow rates through the radiator cores of the cabin radiator 155 and the main radiator 145. Such controls may be utilized by the thermal reduction system 140 dynamically to achieve a target temperature (e.g., ~45° C. measured proximal to the cooling rack 115) that represents an optimal computing environment for the data processing system 110.

In certain aspects, when the temperature of the cooling fluid 112 crosses critical threshold (e.g., 48° C. proximal to the cooling rack 115), the thermal reduction system 140 can initiate a secondary cooling unit 159 comprising an A/C system. The fluid lines for the cooling fluid 112 can be routed through one or more components of the secondary cooling unit 159. For example, the cooling fluid 112 can be routed through an evaporator 170 of the secondary cooling unit 159. In some aspects, the secondary cooling unit 159 uses a separate coolant 171 (e.g., Freon) having distinct chemical properties as compared to the cooling fluid 112. In such aspects, the fluid lines for the cooling fluid 112 can be run through the evaporator 170 in order to be supercooled by the secondary cooling unit 159, but not actually run through the secondary cooling unit 159 itself, which can include its own fluid lines for the coolant 171. Accordingly, the evaporator 170 can be included with a cooling tank 179 with the fluid lines for the cooling fluid 112 running therethrough. When the second cooling unit 159 is not activated by the thermal reduction system 140, the cooling fluid 112 can simply run through the fluid lines into the cooling tank 179 without being further cooled. However, when the second cooling unit 159 is activated, the cooling tank 179 can be supercooled by the evaporator 170, and thus further cool the fluid lines of the cooling fluid 112.

In various implementations, the second cooling unit 159 is initiated by the thermal reduction system 140 via activation of a compressor pump 172 with can compress and pump vaporized coolant 171 through a high pressure fluid line to a condenser 160. In some aspects, the condenser 160 is located at the front of the main radiator 145, such as in an ordinary vehicle. For electric vehicle (EV) applications, the main radiator 145/condenser 160 arrangement can be located at the front end of the EV, similar to conventional internal combustion vehicles. Thus, the arrangement can be repurposed to cool the data processing system 110 of the AV 100, as opposed to the internal combustion engine and the interior cabin (although the evaporator 170 may also include a blower 199 to blow cool air 193 into the passenger interior 195 of the AV 100). Alternatively, the condenser 160 can be a separate component of the secondary cooling unit 159, and can be located proximate to the AV's 100 exterior, to rapidly dissipate heat to the outside air.

In many aspects, the condenser 160 condenses the coolant 171 into a high pressure liquid using ambient air (e.g., via the radiator fan 148). According to examples, the secondary cooling unit 159 can also include a thermal expansion valve 162 to limit the flow rate to the evaporator 170 to enable the evaporator 170 to atomize and supercool the coolant 171, and thus cool the cooling tank 179 and the cooling fluid 112 running therethrough. Accordingly, when the cooling fluid 112 reaches the second threshold (e.g., as measured proximal to the cooling rack 115), or when the temperature delta between temperatures measured distally from and proximally to the cooling rack reaches a certain threshold (e.g., Δ=10° C.), the thermal reduction system 140 can initiate the compressor pump 172 to activate the second cooling unit 159. Furthermore, when the cooling fluid 112 temperature goes below a certain threshold (e.g., ~45° C.), or when the temperature delta goes below a certain threshold (e.g., Δ=5° C.), the thermal reduction system 140 can deactivate the compressor pump 172 and thus shut down the secondary cooling unit 159.

In variations, the coolant 171 and the cooling fluid 112 can be the same chemical, and can be run through both the primary cooling unit 149 and the secondary cooling unit 159. Accordingly, when the fluid temperature reaches the critical threshold (e.g., 48° C.), the thermal reduction system 140 can open a valve to the secondary cooling unit 159, to run the cooling fluid 112 therethrough. The cooling fluid 112 can be pumped through the compressor pump 172 in a high pressure vapor phase, condensed in the condenser 160 into a high pressure liquid, and then atomized in the evaporator 170 before being pumped through the cooling rack 115 to cool the data processing system 110. In such variations, the cooling fluid 112 can be of a type with a proper boiling point well above the maximum temperatures reached when run through the data processing system 110 (e.g., ~60° C.). Example cooling fluids 112 can include certain types of chloroethanes, fluoroethanes, chloroforms, and the like.

As described, the thermal reduction system 140 can be integrated into the AV's 100 A/C system. Namely, the secondary cooling unit 159 can be a dual purpose unit to not only cool the cooling fluid 112, but also to blow cool air into the passenger interior 195 of the AV 100. Thus, using the interior interface system 135 of the AV 100, a passenger can manually activate the secondary cooling unit 159, and a blower 199 can blow cool air 193 from the evaporator 170 into the passenger interior 195. The thermal reduction system 140 can identify when the secondary cooling unit 159 has been manually activated, and make adjustments to the air pump 198 for the cabin radiator 155, and the radiator fan 148 for the main radiator 145.

Along these lines, the thermal reduction system 140 can further operate a valve to close off the secondary cooling unit 159 from the primary cooling unit 149 when the temperature of the cooling fluid 112 is below the critical temperature, and open the valve to supercool the cooling fluid 112 when it reaches the critical temperature. Thus, the secondary cooling unit 159 can operate in isolation of the primary cooling unit 149 as an A/C system of the AV 100, and can operate in unison with the primary cooling unit 149 as a dual purpose A/C system and coolant system for the cooling fluid 112.

Examples provided herein include the dynamic use of a primary 149 and secondary cooling unit 159 to maintain an operational temperature environment for the data processing system 110. Accordingly, the thermal reduction system 140 can be preprogrammed to trigger the various components of the primary 149 and secondary cooling unit 159 within relatively tight tolerances in order to maintain a relatively small temperature delta proximal to and distal from the cooling rack 115 (e.g., within four or five degrees), and within a relatively small temperature range (e.g., between 40-48° C. proximal to the cooling rack 155, and between 48-52° C. distal from the cooling rack 115).

In certain aspects, the thermal reduction system 140 can initiate power controls on any of the cooling units individually for more efficient operation. The power controls can be based on a cooling efficiency optimization with any number of inputs (e.g., outside air temperature, power usage per component, cabin air temperature, a number of passengers, processing requirements, and the like). The output of the power controls by the thermal reduction system 140 can be power signals provided to each component (i.e., the cabin radiator 155, main radiator 145, and evaporator 170/condenser 160 system) that optimize power efficiency in light of the cooling requirements of the data processing system 110.

Furthermore, additional pressure and/or temperature sensors may be included as components of the thermal reduction system 140 for health check or updating purposes. Thus, in some examples, the thermal reduction system 140 can utilize the additional features in conjunction with one or more previously described features to perform periodic health checks and transmit updates to a backend system. The updates can indicate normal performance or identify lacking performance and/or component failure.

Example Cooling Rack

Figure 2:
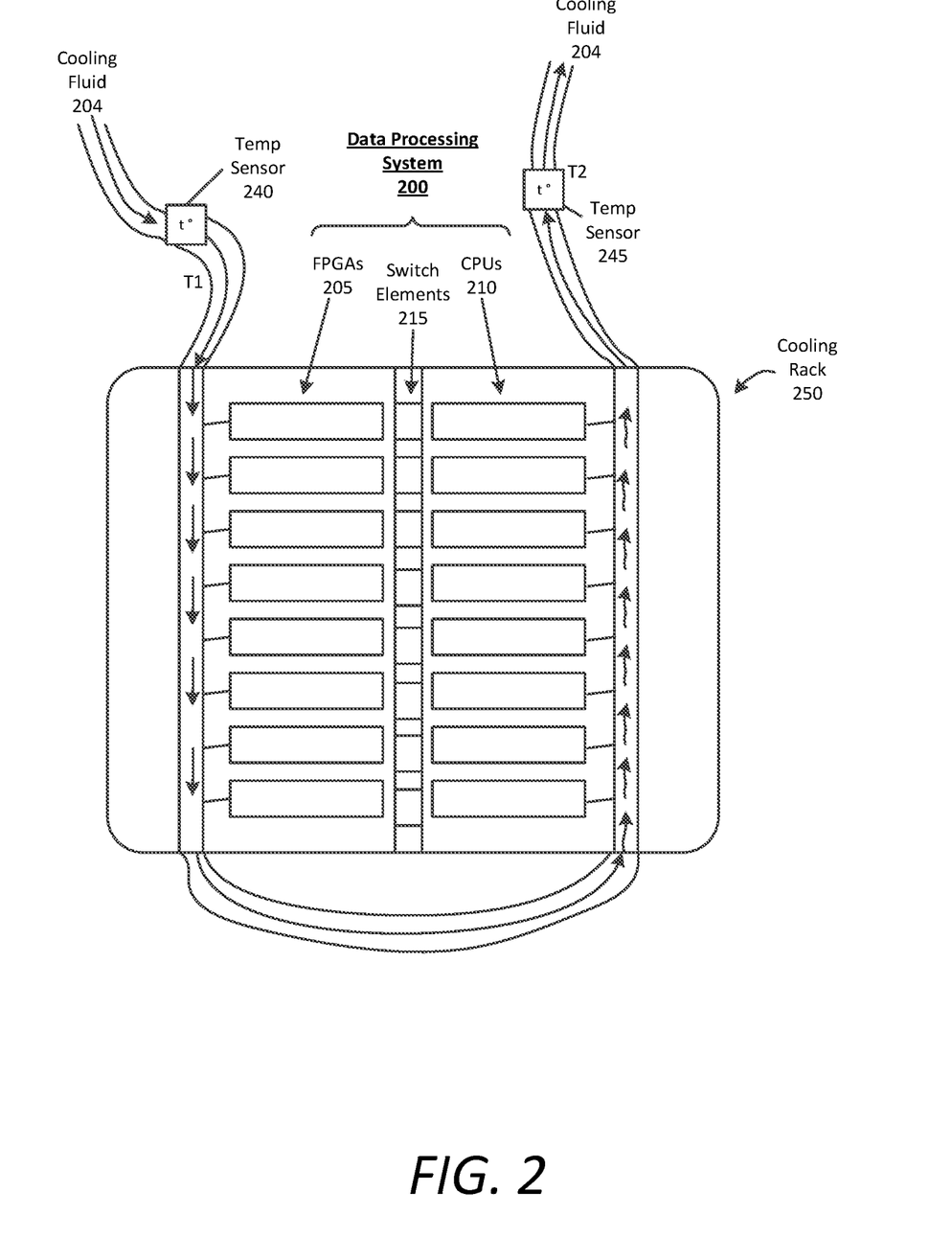
FIG. 2 is a schematic diagram showing an example cooling rack housing data processing system in connection with a thermal reduction system.

FIG. 2 is a schematic diagram showing an example cooling rack 250 housing a data processing system 200 in connection with a thermal reduction system 140. In the example provided in FIG. 2, the data processing system 200 can be the data processing system 110 as illustrated in FIG. 1. Referring to FIG. 2, the thermal reduction system 140 can pump the cooling fluid 204 through a proximal temperature sensor 240 and into the cooling rack 250. The thermal reduction system 140 can further include a distal temperature sensor 245 to measure the temperature of the cooling fluid 204 after it has passed through the cooling rack 250.

In certain aspects, the data processing system 200 can include a combination of FPGAs 205 and CPUs 210 to process sensor data 107 from the AV's 100 sensor array 105. The FPGAs 205 may be more temperature sensitive and output more heat when compared to the CPUs 210. Accordingly, the data processing system 200 can be arranged such that cooling fluid 204 enters the cooling rack 250 and cools the FPGAs 205 first, and then is routed to cool the CPUs 210 next. Other components of the data processing system 200, such as power units and switching elements 215, are deprioritized since they have higher temperature tolerances.

In some implementations, the thermal reduction system 140 can utilize the temperature T1 measured at the proximal temperature sensor 240 for a first purpose, and the temperature T2 measured at the distal temperature sensor 245 for a second purpose. For example, T1 can be utilized to determine whether to initiate the primary and/or secondary cooling units and the components therein. Specifically, when T1 crosses certain thresholds, the thermal reduction system 140 can initiate and vary the air pump 198 for the cabin radiator 155, or the fan 148 for the main radiator 145. As another example, the temperature delta between T2 and T1 can be utilized by the thermal reduction system 140 to vary the flow rate of the cooling fluid 204 into the cooling rack 250. Specifically, a threshold temperature delta can trigger the thermal reduction system 140 to increase the flow rate. Alternatively, the flow rate can be graduated based on the temperature delta.

Methodology

Figure 3:
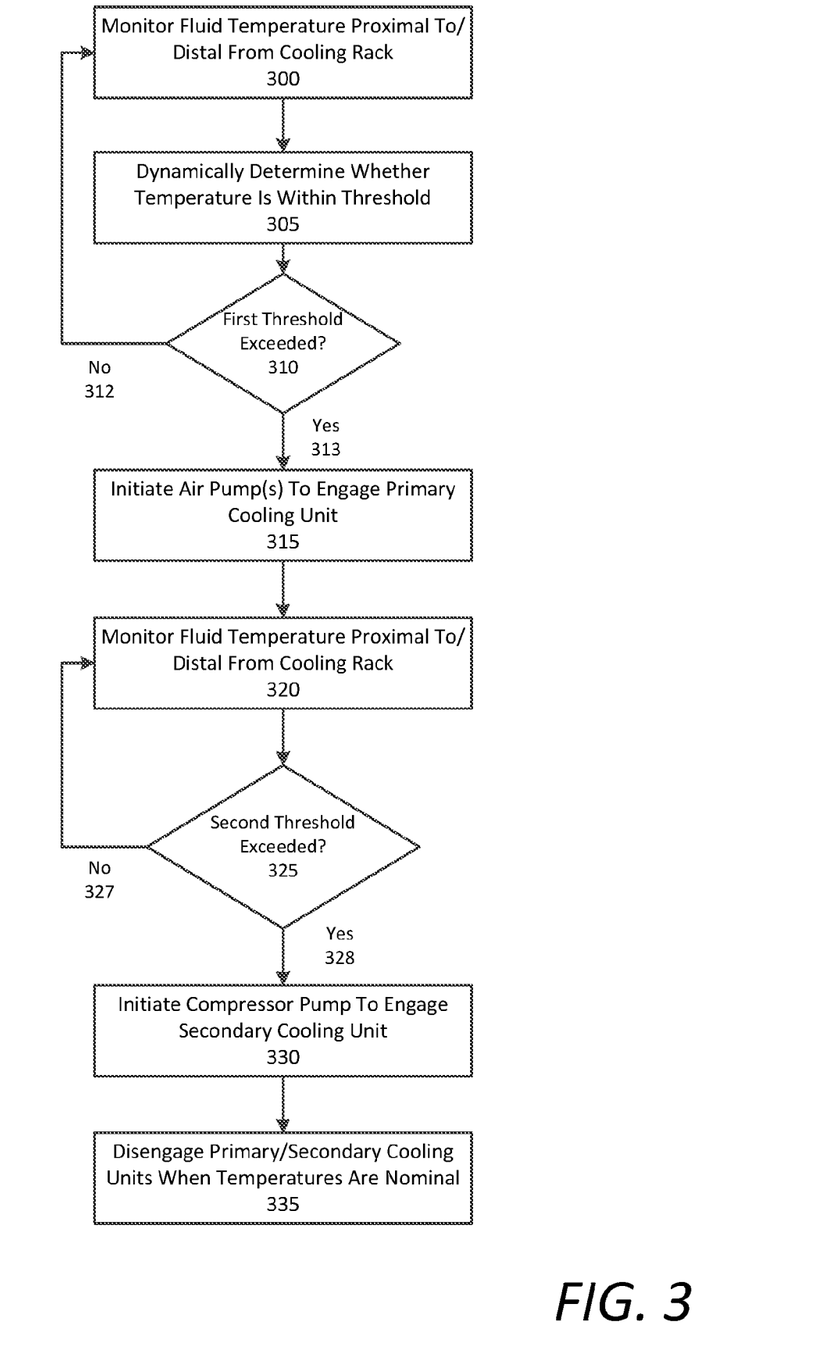
FIG. 3 is a flow chart describing an example method of managing system cooling for a data processing system of an AV.

FIG. 3 is a flow chart describing an example method of managing system cooling for a data processing system 110 of an AV 100. In the below discussion of FIG. 3, reference may be made to like reference characters representing various features of FIG. 1 for illustrative purposes. Furthermore, the method described in connection with FIG. 3 may be performed by an example thermal reduction system 140, or one or more processing units executing instructions in connection with the example thermal reductions system 140, as shown and described with respect to FIG. 1. Referring to FIG. 3, the thermal reduction system 140 can monitor the temperature of cooling fluid 112 proximal to, distal from, and/or within the cooling rack 115 housing the AV's 100 data processing system 110 (300). Each temperature reading or temperature delta between readings can cause the thermal reduction system 140 to trigger the primary 149 and/or secondary cooling unit 159, control the fluid pump(s) 157 to adjust the fluid flow rate, or control the air pump 198 or radiator fan 148 to adjust air flow rates over the radiators 155, 145.

In many implementations, the thermal reduction system 140 can dynamically determine whether the cooling fluid 112 temperature is within a predetermine threshold (305). The threshold may be a specific temperature of the cooling fluid 112 exiting the cooling rack 115 (e.g., ~52° C.), entering the cooling rack 112 (e.g., ~48° C.), or a temperature delta between the two measured temperatures (e.g., $\Delta \leq 4°$ C.). Furthermore, the thermal reduction system 140 can dynamically certify that the cooling fluid 112 temperature through the cooling rack 115 is within a nominal temperature range. Of course, the nominal temperature range can be different for a first measured temperature proximal to the cooling rack 155 (e.g., {nom_range_T1}= (40.0° C.$\leq T_{opt1} \leq$48.0° C.)) as compared to a second measured temperature distally from the cooling rack 115 (e.g., {nom_range_T2}=(51.5° C.$\leq T_{opt2} \leq$52.5° C.)). Furthermore, the overall temperature delta between the actual measured T1 and T2 can have an upper limit (e.g., $\Delta T_{opt} \leq 5.5°$ C.) which can, for example, cause the thermal reduction system 140 to vary the flow rate of the cooling fluid 112, as described herein.

In the example provided in FIG. 3, at decision block (310) the thermal reduction system can determine whether a first temperature threshold is exceeded (e.g., ~42° C. measured proximal to the cooling rack 115). If the first temperature threshold is not exceeded (312), then the thermal reduction system 140 can continue to monitor the cooling fluid 112 temperature (300). However, when the first threshold is exceeded (313), the thermal reduction system 140 can initiate the air pump(s) 198 and/or radiator fan(s) 148 to force air flow through the cabin radiator 155 and/or the main radiator 145, thereby engaging the primary cooling unit 149 (315). In certain conditions, the primary cooling unit 149 may be sufficient to maintain the cooling fluid 112 temperature within the nominal ranges. For example, when the AV 100 is on a highway and sufficient ram air is providing ample flow through the main radiator 145, the cooling fluid 112 may be cooled enough through the main radiator 145 to maintain sufficient cooling fluid 112 temperature.

As another example, the ambient conditions may be relatively cool, and heat generated by the data processing system 110 may be partially dissipated or transferred through the AV 100 bodywork itself, requiring less cooling. The thermal reduction system 140 can anticipate cooling requirements based on the ambient conditions and trigger the radiator fan 148 to blow cool air over the main radiator 145 when necessary. Furthermore, in such cool conditions, the passenger(s) within the passenger interior 195 may run the heater core of the AV 100. The thermal reduction system 140 can detect when the heater core is being run, and prioritize the main radiator 145 over the cabin radiator 155, since the cooler outside air 147 will more efficiently cool the fluid 112 and require less energy. Along these lines, in certain implementations, the thermal reduction system 140 can operate shutoff valves, in conjunction with the air pump 198 and radiator fan 148, to block air flow through either the main radiator 145 or the cabin radiator 155 depending on the ambient conditions, and whether the passengers are running the A/C system or heater core of the AV 100.

While the primary cooling unit 149 is being utilized, the thermal reduction system 140 can increase or decrease air flow through either the main radiator 145 or the cabin radiator 155 depending on the measured temperature of the cooling fluid 112. Furthermore, the thermal reduction system 140 can increase or decrease the fluid flow rate through the fluid lines depending on the measured temperature at one or more locations in the thermal reduction system 140 circuit. Furthermore, while the primary cooling unit 149 is being operated, the thermal reduction system 140 can continue to monitor the fluid temperature proximal to and/or distally from the cooling rack 115 (320).

In certain aspects, when one or more of the radiator fan 148, air pump 198, and the fluid pump 157 are operating at a maximum, the thermal reduction system 140 can determine whether a second threshold temperature has been exceeded (325) (e.g., ~47° C. measured proximal to the cooling rack 115). If the measured temperature has not exceeded the second threshold (327), then the thermal reduction system 140 can continue to monitor the fluid temperature within the fluid lines (320). However, if the measured temperature does exceed the threshold temperature (328), then the thermal reduction system 140 can initiate the compressor pump 172 to engage the secondary cooling unit 159 (330). As discussed herein, the fluid lines can run the cooling fluid 112 through a cooling tank 179 of the evaporator 170. Alternatively, in certain implementations, crossing the second threshold can cause the thermal reduction system 140 to open one or more valves 173 to run the cooling fluid 112 through the secondary cooling unit 159 itself (e.g., the cooling fluid 112 can have properties of both a coolant and refrigerant and can therefore be treated as both a coolant through the primary cooling unit 149, and a refrigerant through the secondary cooling unit 159). In such implementations, the cooling fluid 112 and coolant 171 illustrated in FIG. 1 can be one and the same.

According to examples described herein, the thermal reduction system 140 can monitor the cooling fluid 112 temperature continuously, decrease the fluid flow rate dynamically, and switch the secondary cooling unit 159 on and off dynamically. Furthermore, when the secondary cooling unit 159 is switched on, the thermal reduction system 140 can deactivate one or more of the air pump 198 or radiator fan 148 when the cabin 155 and main radiators 145 are not needed, and/or reduce the fluid flow rate of the cooling fluid 112. It is contemplated that energy efficiency may be a principal concern as technology for AVs 100 continues to evolve and develop. Accordingly, the thermal reduction system 140 can operate dynamically to prioritize lower energy consuming units (e.g., utilizing (i) ram air through the main radiator (zero energy usage), then (ii) the cooler of cabin air 196 or outside air 147, then (iii) increasing the fluid flow rate with the fluid pump 157) over less efficient units or more energy intensive units (e.g., the secondary cooling unit 159).

However, it is also contemplated that priorities may change dynamically depending on ambient conditions, the number of passengers in the AV 100, whether the passenger(s) manually initiate the A/C system or the heater core of the AV 100, and the like. The thermal reduction system 140 can adapt to such dynamic changes on the fly by continuously monitoring not only the cooling fluid 112 temperature, but also various sensors of the AV 100, such as temperature sensors that measure the ambient conditions and/or internal temperature of the passenger interior 195 of the AV 100 (e.g., to prioritize one of the cabin radiator 155 or the main radiator 145 over the other), pressure sensors that detect the number of passengers in the AV 100 (e.g., to limit the cabin air 196 flow rate), on-board sensors that detect when the A/C system or heater core has been initiated (e.g., to vary the flow rate of cabin air 196 to the cabin radiator 155 or prioritize radiators 145, 155), a speed sensor to detect a current speed of the AV 100 (e.g., to control the radiator fan 148 to the main radiator 145 and/or prioritize radiators 145, 155), etc. Accordingly, while monitoring all such sensors of the AV 100, the thermal reduction system 140 can make prioritization decisions and control certain aspects such as the fluid pump(s) 157, the air pump 198, the radiator fan 149, the compressor pump 172, and any number of valves that may restrict air flow from the passenger interior 195 or the outside air 147, and/or fluid flow through the primary 149 and secondary cooling unit 159. Furthermore, at any given time while monitoring such sensors and the fluid temperature, the thermal reduction system 140 can disengage the primary 149 and secondary cooling unit 159 when fluid temperatures are within the nominal ranges (335).

Examples described herein for optimizing energy efficiency for the thermal reduction system 140 can utilize a fluid temperature/flow rate control table to control the fluid pump 157, main radiator fan 148, and cabin air pump 198. The control table can be generated based on any number of conditions of the AV 100 including, for example, the cooling fluid 112 temperature. Thus, the thermal reduction system 140 can provide variable power to each component depending on at least the cooling fluid 112 temperature in order to maximize energy efficiency.

Figure 4:
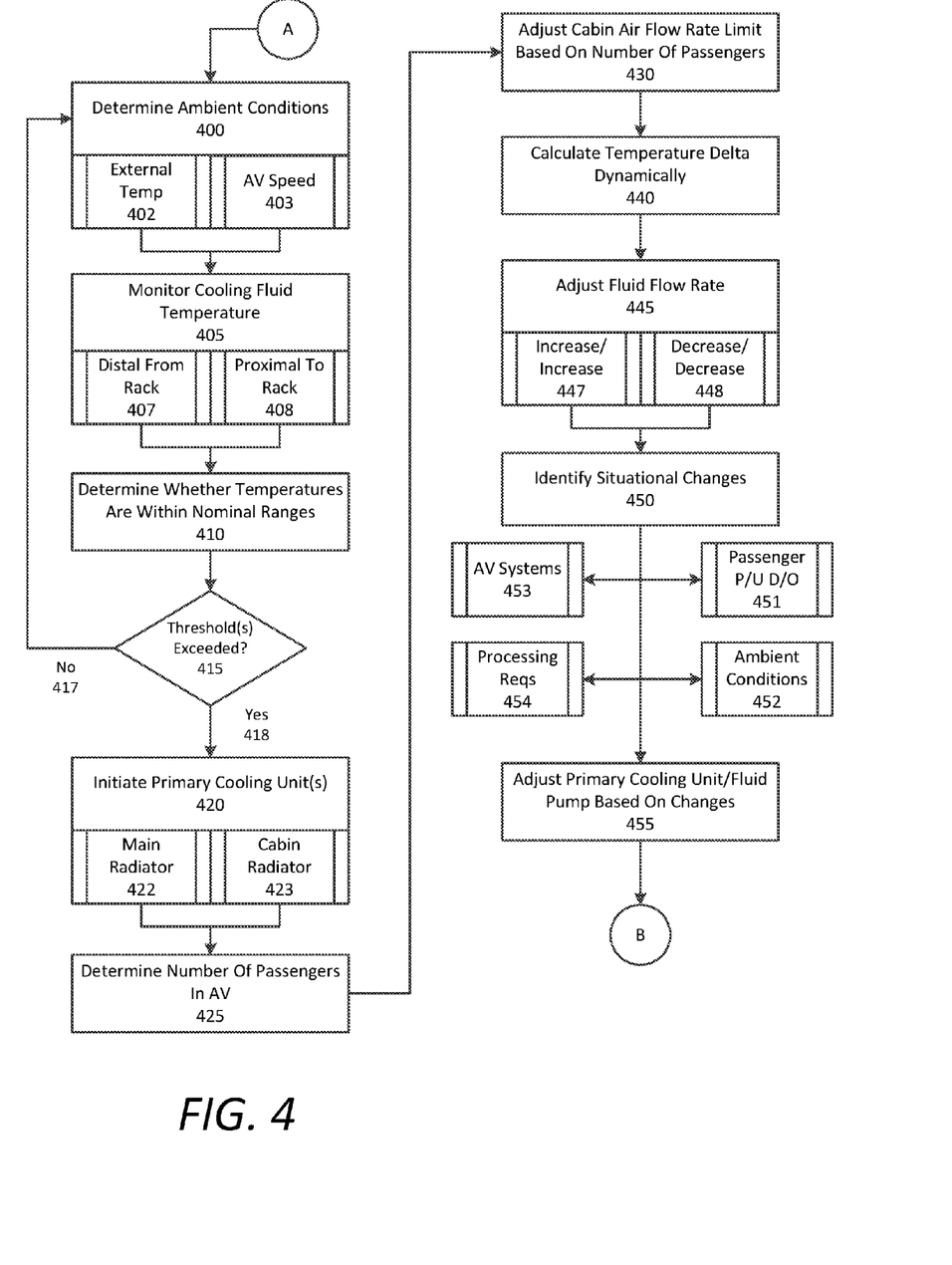
FIGS. 4 and 5 are flow charts describing respective methods of managing system cooling for a data processing system of an AV.
Figure 5:
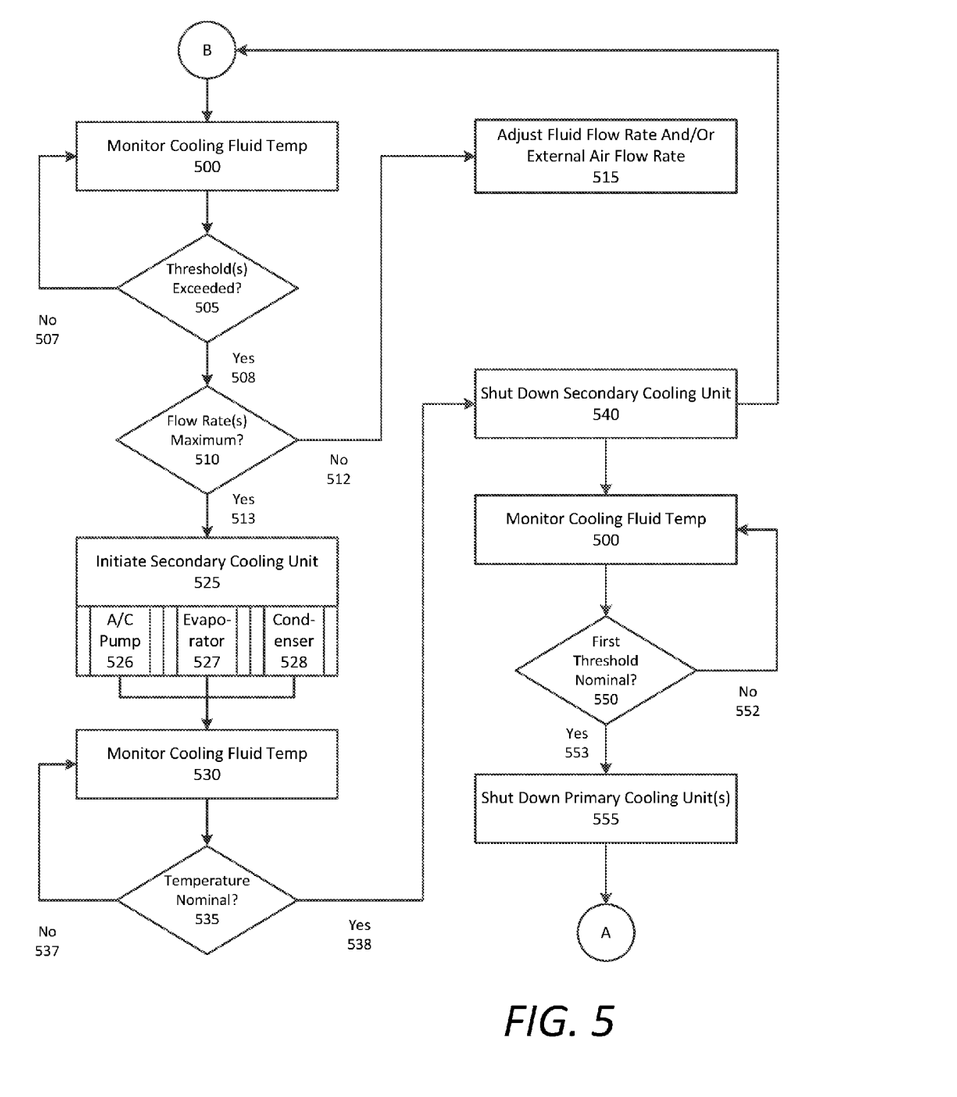

FIGS. 4-5 are flow charts describing example methods of managing system cooling for a data processing system 110 of an AV 100. In the below discussion of FIGS. 4-5, reference may be made to like reference characters representing various features of FIG. 1 for illustrative purposes. Furthermore, the examples described in connection with FIG. 4 may be performed by an example thermal reduction system 140, or one or more processing units executing instructions in connection with the example thermal reduction system 140, as shown and described with respect to FIG. 1. Referring to FIG. 4, the process described is dynamic and can be cyclical and therefore an initial step of the process is largely arbitrary, and denoted as "A" in FIG. 4. At any given time, the thermal reduction system 140 can determine the ambient conditions of the AV 100 (400). The ambient conditions can comprise the external temperature of the AV 100 (402) and the speed of the AV 100 itself (403). The ambient conditions can further include the weather, absolute humidity, relative humidity, specific humidity, barometric pressure, wind speed and direction, map data, and other aspects that may affect the cooling requirement of the on-board data processing system 110. The thermal reduction system 140 can utilize the ambient conditions data to control the fluid pump 157, air pump 198, radiator fan 149, compressor pump 172, and one or more valves 173 in order to anticipate cooling requirements, or to respond proactively to temperature fluctuations in the cooling fluid 112.

For example, the ambient conditions may indicate that the AV 100 has stopped or is in traffic near a busy intersection that requires increased data processing by the data processing system 110. Because the AV 100 is stopped, ram air is not available through the main radiator 145. Thus, the thermal reduction system 140 can detect the ambient temperature, prioritize the cabin radiator 155, and increase the cabin air 196 flow rate to its maximum while monitoring the cooling fluid 112 temperature (405). The thermal reduction system can monitor the cooling fluid 112 temperature continually distally from (407) and/or proximally to (408) the cooling rack 115 in which the data processing system 110 is housed.

In many examples, each measured temperature location within the fluid line may have its own nominal range, and the thermal reduction system 140 can determine whether any initial temperature threshold is crossed at any of the locations (415). Accordingly, if the temperatures remain within nominal ranges (417), the thermal reduction system 140 can continue to monitor the cooling fluid 112 temperature (405). However, when an initial temperature threshold is crossed (418), the thermal reduction system can initiate the primary cooling unit 149 (420). That is, the thermal reduction system 140 can initiate the air pump 198 to force air flow over the cabin radiator 155 (423) and/or the radiator fan 148 to force air flow over the main radiator 145 (422).

At any given time, the thermal reduction system 140 can determine or detect a number of passengers in the AV 100 (425). Based on the number of passengers, the thermal reduction system 140 can adjust a cabin air 196 flow rate limit (430), thereby setting a limit to how much power to provide to the air pump 198. In some aspects, the thermal reduction system 140 can further monitor the static suspension position of the AV 100 to determine an approximate weight of the AV 100, which includes the overall passenger weight. The passenger weight can be identified by the thermal reduction system 140 to set a maximum constraint on the amount of air capable of being drawn in from the interior cabin 195 as well as an estimated amount of in-cab heat generation. Furthermore, in some aspects, the thermal reduction system 140 can calculate a temperature delta between the proximal and distal temperature sensors dynamically (440). The thermal reduction system 140 can utilize the temperature delta to, for example, control the fluid pump 157 to adjust a flow rate of the cooling fluid through the circuit. Accordingly, when the temperature delta increases, the thermal reduction system 140 can increase the flow rate (447). Conversely, when the temperature delta decreases, the thermal reduction system 140 can decrease the fluid flow rate (448). Control of the fluid flow rate can be performed dynamically to maintain a constant or near-constant temperature delta, or to maintain the temperature delta within its own nominal range.

While the primary cooling unit 149 is active, the thermal reduction system 140 can identify situational changes in connection with the AV 100 (450). Such situational changes can include, for example, passenger pick-up and drop-off (451), changes in ambient conditions (452), changes in the AV systems (453 (e.g., manual activation of the A/C system or heater core), or changes in the processing requirements for the data processing system 110 (454) (e.g., when the AV 100 enters a high traffic area). Based on the situational changes, the thermal reduction system 140 can adjust the primary cooling unit 149 and the fluid pump(s) 157 to meet the increased or decreased cooling requirements proactively (455). The process may then flow to item "B," which along with "A," can denote nearly any arbitrary step in the process discussed in connection with FIGS. 4-5.

Referring to FIG. 5, while the primary cooling unit 149 is activated, the thermal reduction system 140 can continue to monitor the cooling fluid 112 temperature at any number of locations (500). The thermal reduction system 140 can further determine whether a second temperature threshold has been exceeded (505). If not (507), then the thermal reduction system 140 can continue to monitor the cooling fluid 112 temperature. However, if the second temperature threshold has been exceeded (508) (e.g., T>~48° C. proximal to the cooling rack 115), then the thermal reduction system 140 can determine whether the fluid flow rate and/or the air flow rates are at a maximum for the primary cooling unit (510). If the flow rate(s) are not at a maximum (512), the thermal reduction system 140 can adjust one or more of the fluid flow rate or the air flow rate(s) through the cabin radiator 155 or main radiator 145 accordingly (515).

However, if the flow rate(s) are at a maximum (513), then the thermal reduction system 140 can initiate the secondary cooling unit 159 (525). In many aspects, initiating the secondary cooling unit 159 comprises activating an A/C or compressor pump 172 (526), which can in turn activate the evaporator 170 (527) and the condenser 160 (528). In variations, the thermal reduction system 140 can activate control valves to enable the cooling fluid 112 to flow through the secondary cooling unit 159, and be pumped out of the evaporator 170 in a supercooled state before being run through the cooling rack 115. Alternatively, the evaporator 170 can include a cooling tank 179 through which the fluid lines are plumbed. When the secondary cooling unit 159 is activated, the cooling tank 179 can be cooled by the evaporator 170, thus further cooling the cooling fluid 112.

When the secondary cooling unit 159 is activated, the thermal reduction system 140 can continue to monitor the cooling fluid temperature (530). In some aspects, the thermal reduction system 140 can include a thermostat to automatically shut off the secondary cooling unit 159 when the cooling fluid 112 drops to a certain temperature (e.g., ~38° C.). Additionally or alternatively, the thermal reduction system 140 can determine whether the cooling fluid 112 temperatures have normalized to within the nominal ranges (535). If not (537), then the thermal reduction system 140 can maintain activation of the secondary cooling unit 159 and continue to monitor the cooling fluid 112 temperature (530). However, if the temperatures have been normalized to within the nominal ranges (538), then the thermal reduction system 140 can shut down the secondary cooling unit 159 (540).

At this point, with the secondary cooling unit 159 in hibernation, the thermal reduction system 140 can monitor the cooling fluid temperature for increases above the secondary threshold (500, 505, 508), in which case the thermal reduction system 140 can reinitiate the secondary cooling unit 159 (525). Additionally, the thermal reduction system 140 can monitor for decreases in the temperature below the initial threshold (500), and determine whether the cooling fluid 112 temperature is within the original nominal ranges (550). If not (552), then the thermal reduction system 140 can continue monitoring (500). However, if the thermal reduction system 140 determines that the cooling fluid 112 temperatures are nominal and do not require additional cooling (553), then the thermal reduction system can shut down the primary cooling unit (555) and continue monitoring. Accordingly, the process can be cycled back through to "A" as shown in both FIG. 4 and FIG. 5.

Hardware Diagrams

Figure 6:
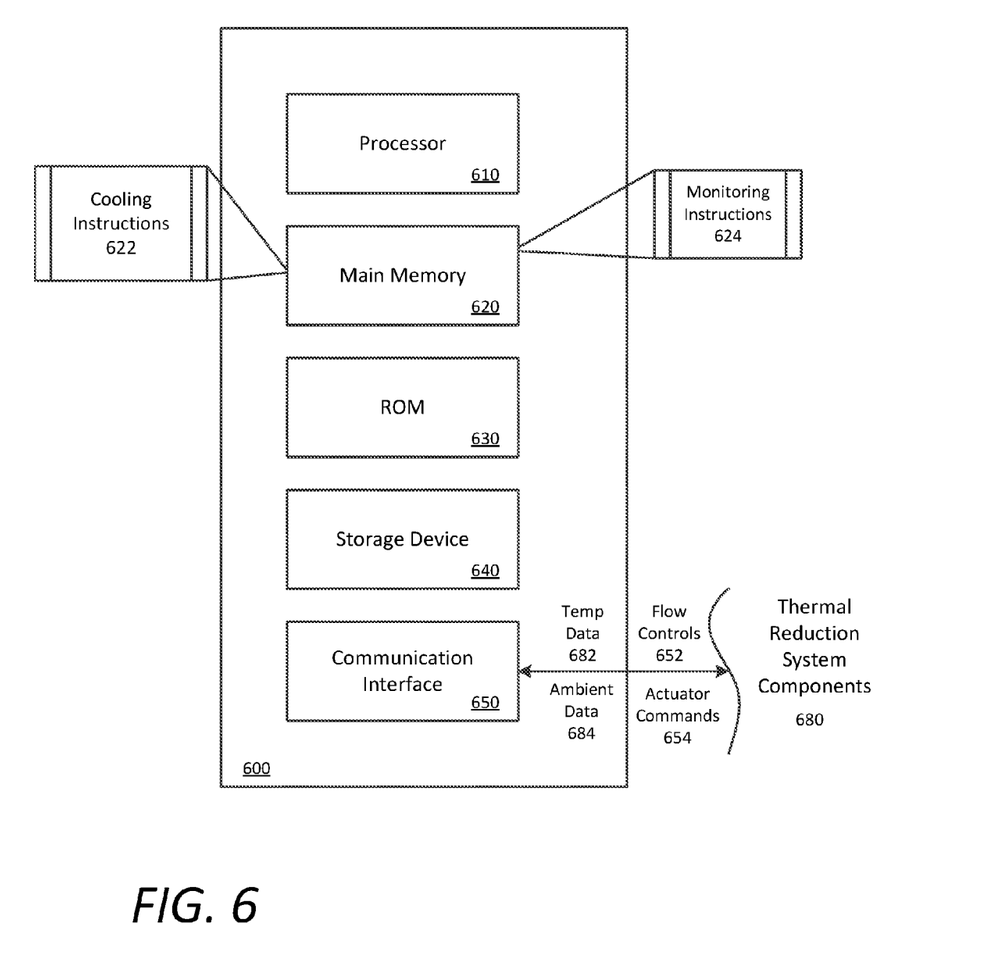
FIG. 6 is a block diagram that illustrates a computer system upon which examples described herein may be implemented.

FIG. 6 is a block diagram that illustrates a computer system 600 upon which examples described herein may be implemented. A computer system 600 can be implemented on, for example, a server or combination of servers. For example, the computer system 600 may be implemented as part of the on-board data processing system 110 of the AV 100 as shown and described with respect to FIG. 1. Furthermore, in the context of FIG. 1, the thermal reduction system 140 may be implemented using a computer system 600 such as described by FIG. 6. The thermal reduction system 140 may also be implemented using a standalone system or a combination of multiple computer systems as described in connection with FIG. 6. Furthermore, the computer system 600 described with respect to FIG. 6 can be a standalone microprocessor and/or PC or multiple microprocessors or PCs.

In one implementation, the computer system 600 includes processing resources 610, a main memory 620, a read-only memory (ROM) 630, a storage device 640, and a communication interface 650. The computer system 600 includes at least one processor 610 for processing information stored in the main memory 620, such as provided by a random access memory (RAM) or other dynamic storage device, for storing information and instructions which are executable by the processor 610. The main memory 620 also may be used for storing temporary variables or other intermediate information during execution of instructions to be executed by the processor 610. The computer system 600 may also include the ROM 630 or other static storage device for storing static information and instructions for the processor 610. A storage device 640, such as a magnetic disk or optical disk, is provided for storing information and instructions.

The communication interface 650 enables the computer system 600 to communicate with the components of the thermal reduction system 680 through use of wireless electronic links or a wired interface such as an internal and/or external bus. Using the electronic link, the computer system 600 can communicate with the thermal reduction system 140 components, such as the air pump 196, fluid pump 157, radiator fan 149, compressor pump 172, and any number of valves that restrict or constrain air or fluid flow thorough the thermal reduction system 140 circuit, as shown an described in connection with FIG. 1. In accordance with examples, the computer system 600 receives temperature data 682 and ambient data 684 via a set of sensors of the AV 100. The executable instructions stored in the memory 630 can include cooling instructions 622, which the processor 610 executes to determine the cooling requirements of the data processing system 110 and proactively initiate the primary 149 and/or secondary cooling unit 159. As discussed herein, the ambient data can comprise the external temperature of the AV 100, the speed of the AV 100, weather data, humidity data, pressure data, wind speed and direction, map data, the number of passengers in the AV 100, and other aspects that may affect the cooling requirements of the on-board data processing system 110.

The executable instructions stored in the memory 620 can also include monitoring instructions 624, which enable the computer system 600 to continuously monitor the cooling fluid 112 temperature within the thermal reduction system 140 and activate the primary 149 and/or secondary cooling unit 159 in response to temperatures crossing predetermined thresholds. By way of example, the instructions and data stored in the memory 620 can be executed by the processor 610 to implement an example thermal reduction system of FIG. 1. In performing the operations, the processor 610 can receive temperature data 682 and ambient data 684, and generate and transmit flow controls 652 to the air/fluid pumps (157, 148, 198, 172) and/or actuator commands 654 to activate either the primary 149 or secondary cooling unit 159.

The processor 610 is configured with software and/or other logic to perform one or more processes, steps and other functions described with implementations, such as described in connection with FIGS. 1-5, and elsewhere in the present application.

Examples described herein are related to the use of the computer system 600 for implementing the techniques described herein. According to one example, those techniques are performed by the computer system 600 in response to the processor 610 executing one or more sequences of one or more instructions contained in the main memory 620. Such instructions may be read into the main memory 620 from another machine-readable medium, such as the storage device 640. Execution of the sequences of instructions contained in the main memory 620 causes the processor 610 to perform the process steps described herein. In alternative implementations, hard-wired circuitry may be used in place of or in combination with software instructions to implement examples described herein. Thus, the examples described are not limited to any specific combination of hardware circuitry and software.

It is contemplated for examples described herein to extend to individual elements and concepts described herein, independently of other concepts, ideas or system, as well as for examples to include combinations of elements recited anywhere in this application. Although examples are described in detail herein with reference to the accompanying drawings, it is to be understood that the concepts are not limited to those precise examples. As such, many modifications and variations will be apparent to practitioners skilled in this art. Accordingly, it is intended that the scope of the concepts be defined by the following claims and their equivalents. Furthermore, it is contemplated that a particular feature described either individually or as part of an example can be combined with other individually described features, or parts of other examples, even if the other features and examples make no mentioned of the particular feature. Thus, the absence of describing combinations should not preclude claiming rights to such combinations.

What is claimed is:

1. A thermal reduction system for an autonomous vehicle (AV) comprising:
   a cooling rack coupled to a data processing system of the AV;
   a fluid pump pumping cooling fluid through the cooling rack to cool the data processing system;
   a cabin radiator receiving the cooling fluid and forcing cabin air from an interior passenger cabin of the AV though the cabin radiator to cool the cooling fluid;
   a main radiator receiving the cooling fluid and forcing outside air through the main radiator to further cool the cooling fluid;
   one or more sensors detecting one or more passengers within the interior passenger cabin of the AV; and
   one or more processors executing instructions that cause the one or more processors to:

establish an upper limit to a flow rate of the cabin air from the interior passenger cabin through the cabin radiator based on detecting the one or more passengers.

2. The thermal reduction system of claim 1, further comprising:
a secondary cooling unit comprising a compressor pump, a condenser, and an evaporator.

3. The thermal reduction system of claim 2, wherein the compressor pump initiates automatically when the cooling fluid reaches a predetermined temperature at a temperature sensor.

4. The thermal reduction system of claim 3, wherein the secondary cooling unit further includes a blower providing cool air from the evaporator into the interior passenger cabin of the AV when a passenger of the AV manually triggers the secondary cooling unit.

5. The thermal reduction system of claim 2, wherein the fluid pump further pumps the cooling fluid through fluid lines that run through a cooling tank of the evaporator, and wherein when the secondary cooling unit is initiated, the evaporator cools the cooling tank to further cool the cooling fluid.

6. The thermal reduction system of claim 2, further comprising:
a first temperature sensor disposed proximally to the data processing system; and
a second temperature sensor disposed distally from the data processing system;
wherein a temperature delta for the cooling fluid between the first temperature sensor and the second temperature sensor causes the fluid pump to vary a flow rate of the cooling fluid.

7. The thermal reduction system of claim 6,
wherein the executed instructions further cause the one or more processors to:
continuously monitor a first temperature of the cooling fluid at the first temperature sensor and a second temperature of the cooling fluid at the second temperature sensor;
initiate one or more air pumps of at least one of the cabin radiator or the main radiator when the cooling fluid reaches an initial threshold temperature at one of the first temperature sensor or the second temperature sensor;
initiate the compressor pump when the cooling fluid reaches a critical threshold temperature at one of the first temperature sensor or the second temperature sensor; and
control the fluid pump to adjust the flow rate of the cooling fluid based on the temperature delta between the first temperature sensor and the second temperature sensor.

8. The thermal reduction system of claim 7, wherein the executed instructions further cause the one or more processors to:
determine processing requirements of the data processing system; and
adjust flow rates of one or more of the cabin radiator, the main radiator, the fluid pump, or the compressor pump based on the processing requirements.

9. The thermal reduction system of claim 7, wherein the one or more processors of the thermal reduction system are included in the data processing system coupled to the cooling rack.

10. The thermal reduction system of claim 1, wherein the data processing system comprises one or more field programmable gate arrays (FPGAs) and one or more central processing units (CPUs).

11. The thermal reduction system of claim 10, wherein the fluid pump pumps the cooling fluid through the cooling rack to cool the one or more FPGAs before the one or more CPUs.

12. The thermal reduction system of claim 10, wherein the data processing system further comprises one or more switching elements.

13. The thermal reduction system of claim 12, wherein the fluid pump pumps the cooling fluid through the cooling rack to cool the one or more FPGAs and the one or more CPUs before the one or more switching elements.

14. The thermal reduction system of claim 1, further comprising:
one or more redundant fluid pumps to pump the cooling fluid when the fluid pump fails.

15. An autonomous vehicle (AV) comprising:
a control system operating controls of the AV;
an interior cabin accommodating a plurality of passengers;
a plurality of sensors detecting real-time environment data as the AV is operated;
a data processing system coupled to a cooling rack and connected to the plurality sensors, the data processing system processing the real-time environment data to operate the AV in a traffic environment; and
a thermal reduction system cooling the data processing system, the thermal reduction system comprising:
a fluid pump pumping cooling fluid through the cooling rack;
a cabin radiator receiving the cooling fluid and forcing cabin air from the interior cabin of the AV through the cabin radiator to cool the cooling fluid;
a main radiator receiving the cooling fluid and forcing outside air through the main radiator to further cool the cooling fluid;
one or more sensors detecting one or more passengers within the interior passenger cabin of the AV; and
one or more processors executing instructions that cause the one or more processors to:
establish an upper limit to a flow rate of the cabin air from the interior passenger cabin through the cabin radiator based on detecting the one or more passengers.

16. The AV of claim 15, wherein the thermal reduction system further comprises:
a first temperature sensor detecting a temperature of the cooling fluid;
a secondary cooling unit comprising a compressor pump, a condenser, and an evaporator, wherein fluid lines for the cooling fluid run through a cooling tank of the evaporator;
wherein the executed instructions further cause the one or more processors to:
monitor the temperature of the cooling fluid at the first temperature sensor; and
initiate the secondary cooling unit to further cool the cooling fluid when the monitored temperature crosses a critical threshold.

* * * * *